United States Patent
Jensen (10) Patent No.: US 7,398,071 B2
(45) Date of Patent: Jul. 8, 2008

(54) LOOP FILTER WITH GEAR SHIFT FOR IMPROVED FRACTIONAL-N PLL SETTLING TIME

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 585 days.

(21) Appl. No.: 11/015,101

(22) Filed: Dec. 17, 2004

(65) Prior Publication Data

US 2006/0135105 A1 Jun. 22, 2006

(51) Int. Cl.
*H04B 1/16* (2006.01)

(52) U.S. Cl. .................. 455/260; 455/161.2; 455/165.1; 455/139; 455/180.3; 331/15; 331/17

(58) Field of Classification Search ................. 455/260, 455/161.2, 165.1, 139, 180.3; 331/16, 17
See application file for complete search history.

(56) References Cited

U.S. PATENT DOCUMENTS

| | | | | |
|---|---|---|---|---|
| 3,757,244 A | * | 9/1973 | Giger | 331/17 |
| 4,330,758 A | * | 5/1982 | Swisher et al. | 331/1 A |
| 4,546,329 A | * | 10/1985 | Unger | 331/16 |
| 4,568,888 A | * | 2/1986 | Kimura et al. | 331/10 |
| 5,128,625 A | * | 7/1992 | Yatsuzuka et al. | 327/156 |
| 5,596,372 A | * | 1/1997 | Berman et al. | 348/537 |
| 5,701,598 A | * | 12/1997 | Atkinson | 455/161.2 |
| 5,982,821 A | * | 11/1999 | Kingston et al. | 375/326 |
| 6,546,044 B1 | * | 4/2003 | Dent | 375/216 |
| 6,831,523 B1 | * | 12/2004 | Pastorello et al. | 331/25 |

* cited by examiner

*Primary Examiner*—Sanh D. Phu
(74) *Attorney, Agent, or Firm*—Garlick, Harrison & Markison; James A. Harrison (57) ABSTRACT

An integrated circuit radio frequency (RF) transmitter includes a phase locked loop having a multi-mode loop filter that is operable to provide wide band response with a fast settle time in a startup mode of operation and a relatively more narrow response with a longer settle time but with improved filtering in a steady state mode of operation according to one embodiment of the invention. The multi-mode loop filter includes, in one embodiment, selectable resistance circuitry for selecting between a plurality of resistance values based upon a two-state multi-mode control signal to provide the selected resistance values and selectable capacitance circuitry for selecting between a plurality of capacitance values based upon the two-state multi-mode control signal and for operatively coupling selected capacitors to selected resistors to provide the selected capacitance values. As a further aspect of the embodiment of the present invention, the multi-mode loop filter includes buffers for charging non-selected capacitors while not operationally coupled to the multi-mode loop filter to avoid additional settle time for the circuitry.

18 Claims, 10 Drawing Sheets

LOOP FILTER WITH GEAR SHIFT FOR IMPROVED FRACTIONAL-N PLL SETTLING TIME

BACKGROUND

1. Technical Field

The present invention relates to wireless communications and, more particularly, radio front end circuitry for up-converting and down-converting transmission signals.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

The demand for high performance universal frequency synthesizers is growing with the increasing performance and integration requirements of wireless communications systems such as cellular telephones and personal digital assistants (PDAs). The driving forces are lower cost, smaller form factors, and lower power consumption for consumer end products. Fractional-N phase locked loop (PLL) frequency synthesis is a popular indirect frequency synthesis method for high performance applications such as cellular telephony due to its agility and the ability of synthesizing frequencies over wide bandwidths with narrow channel spacing. For example, in GSM cellular telephony, one pair of RF bands, i.e., transmit (TX) and receive (RX) bands, consists of the frequencies 880.2 MHz-914.8 MHz and 925.3 Mhz-959.9 MHz, respectively. The four RF bands of GSM are also referred to as the GSM850, GSM900, DCS, and PCS bands, respectively. Typical architectures for such radios include a single oscillator that is divided to produce the specified output frequency that is required for an outgoing radio frequency transmission. The dividend, however, often is not a whole number and thus the term "Fractional-N" refers to a non-integer dividend that is used in a PLL to produce the desired output frequency. While Fractional-N PLLs are known, there is an ever increasing need for Fractional-N PLLs that are more efficient or are optimized for a particular application.

SUMMARY OF THE INVENTION

The present invention is directed to apparatus and methods of operation that are further described in the following Brief Description of the Drawings, Detailed description of the Invention, and the Claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
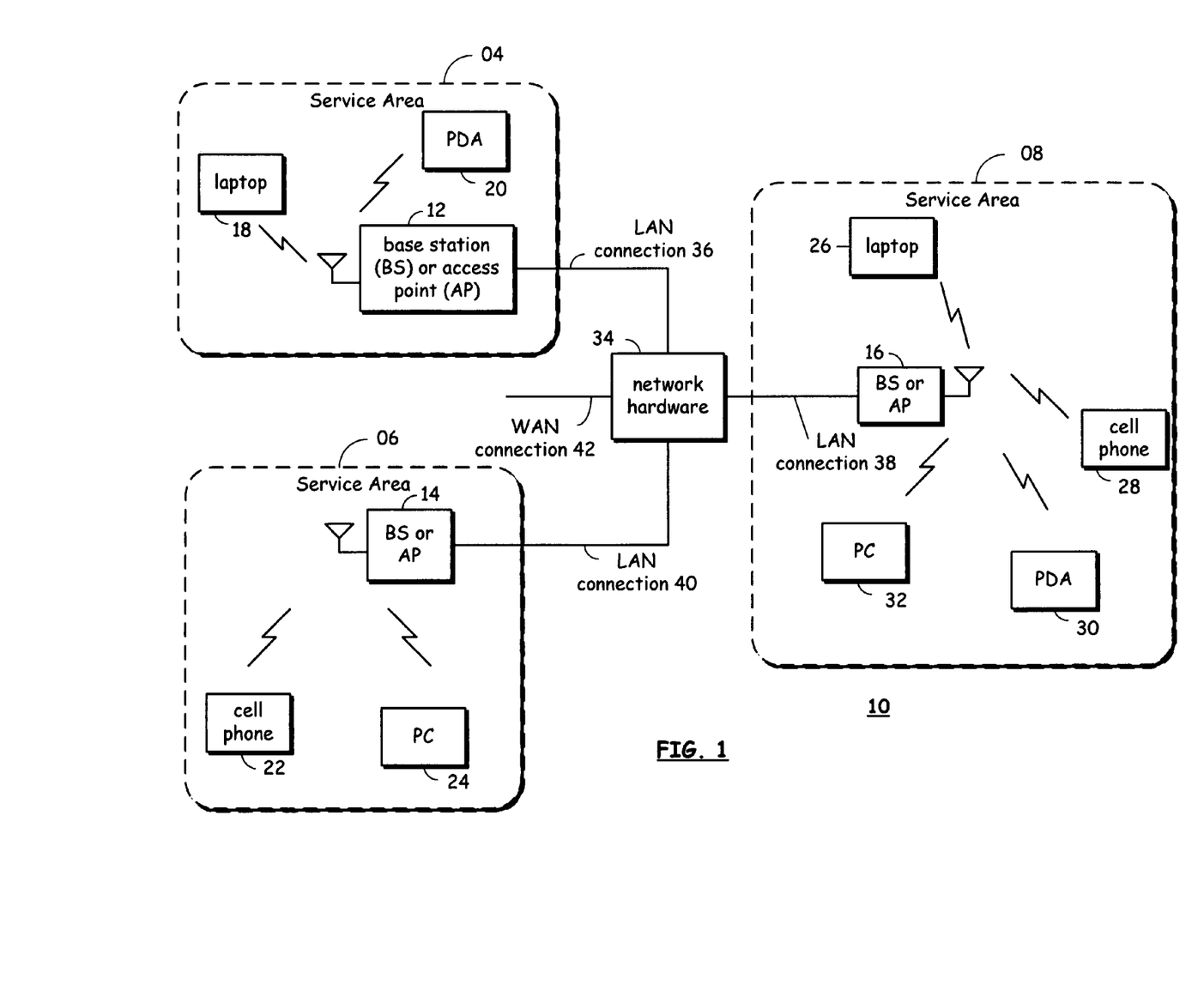
FIG. 1 is a functional block diagram illustrating a communication system that includes a plurality of base stations or access points (APs), a plurality of wireless communication devices and a network hardware component.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10 to an external network element. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
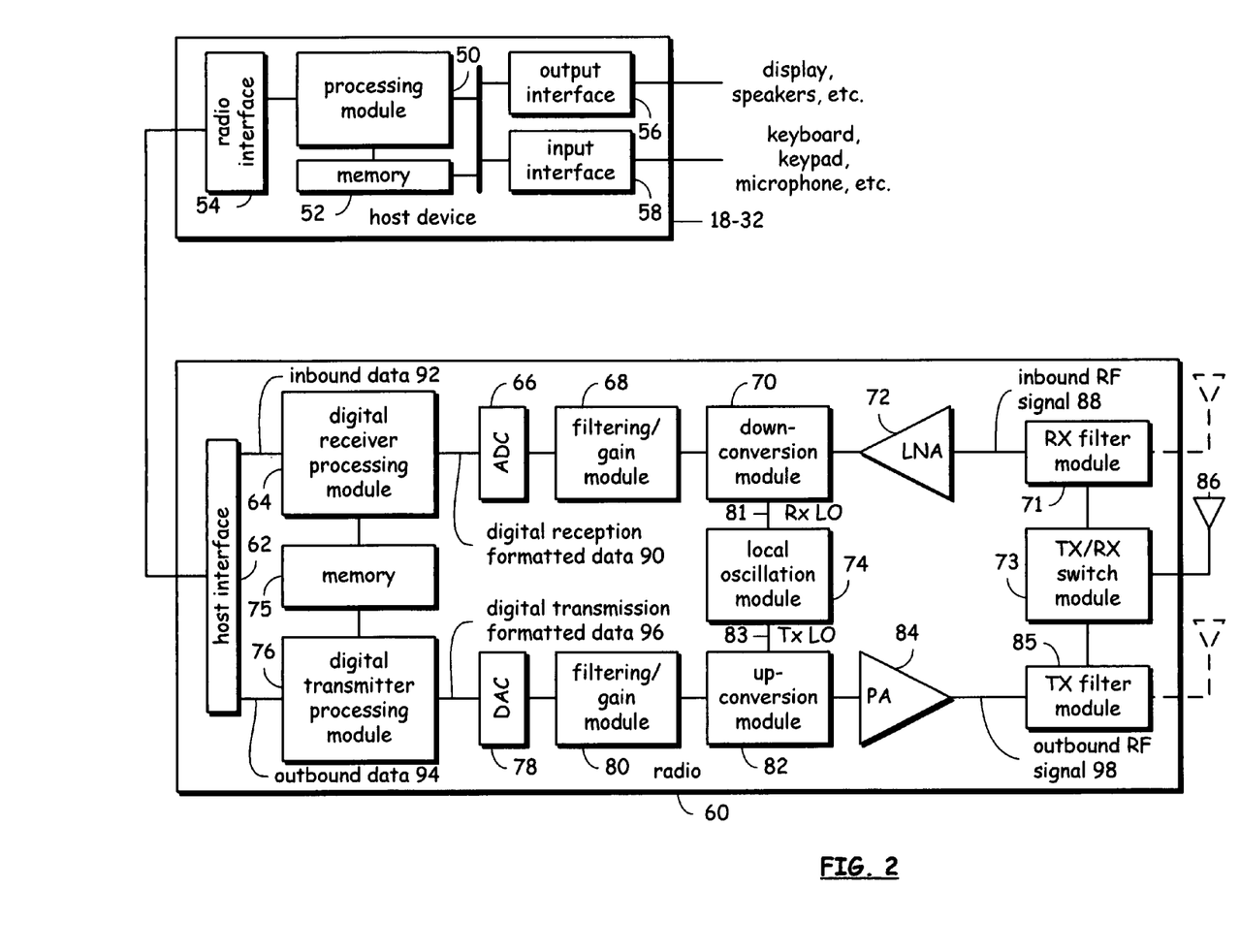
FIG. 2 is a schematic block diagram illustrating a radio frequency (RF) transmitter architecture including a baseband processor and a radio processor according to one embodiment of the present invention.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard (e.g., IEEE 802.11a, IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

The wireless communication device of FIG. 2 is one that may be implemented to include either a direct conversion from RF to baseband and baseband to RF or for a conversion by way of a low intermediate frequency. In either implementation, however, for up-conversion module 82 and down-conversion module 70, it is required to provide accurate frequency conversion. For down-conversion module 70 and up-conversion module 82 to accurately mix a signal, however, it is important that local oscillation module 74 provide an accurate local oscillation signal for mixing with the baseband or RF by up-conversion module 82 and down-conversion module 70, respectively.

Accordingly, local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
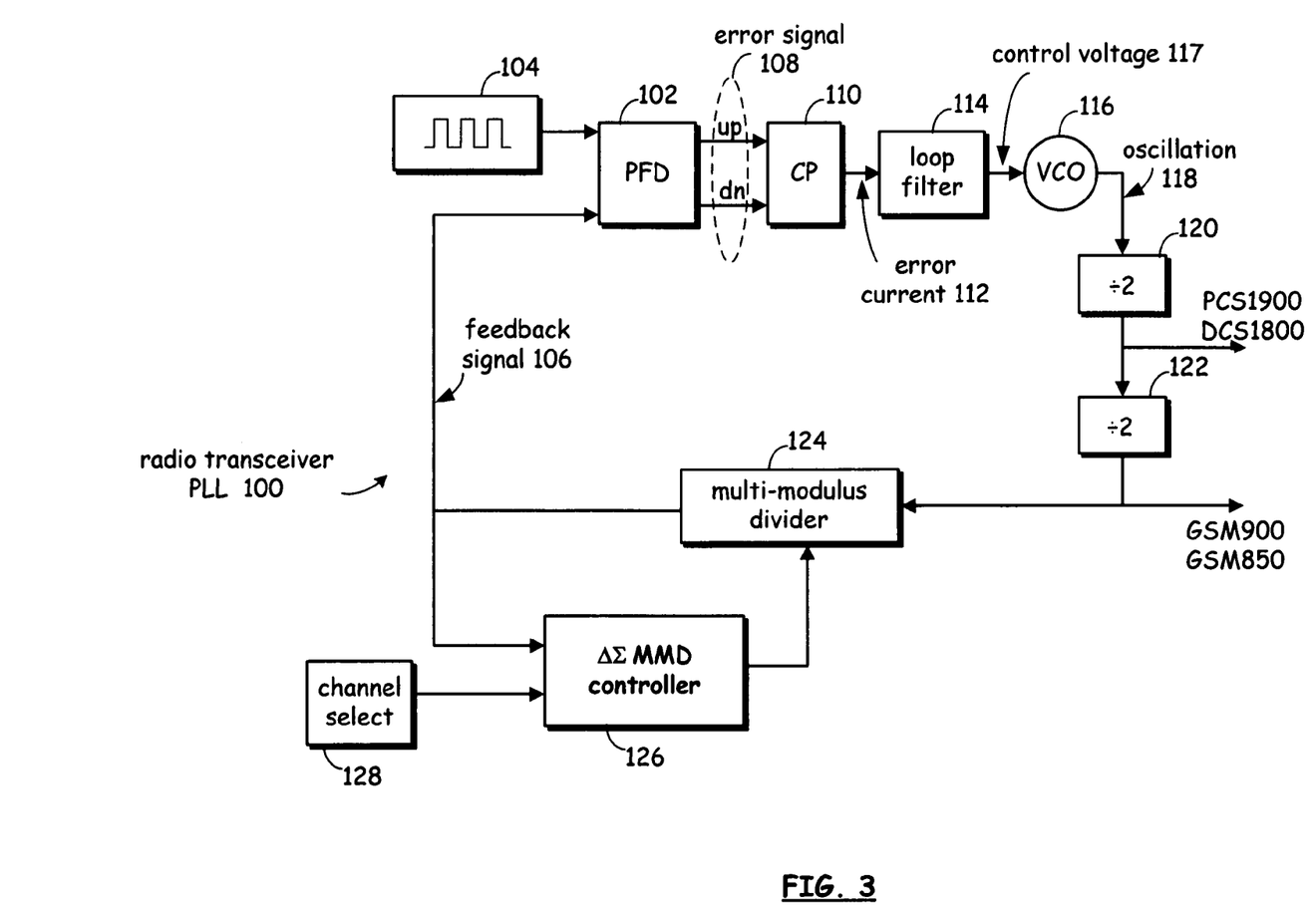
FIG. 3 is a functional block diagram of a fractional-N phase locked loop (PLL) when used as a frequency synthesizer in a quad-band GSM cellular telephone according to one embodiment of the present invention.

FIG. 3 is a functional block diagram of a fractional-N phase locked loop (PLL) when used as a frequency synthesizer in a quad-band GSM cellular telephone according to one embodiment of the present invention. A radio transceiver PLL 100 includes a phase frequency detector (PFD) 102 that is coupled to receive a precise reference frequency from a crystal oscillator 104 for comparing with a feedback signal 106. PFD 102 produces an error signal 108. A charge pump (CP) 110 produces an error current 112 based upon the error signal 108 to a low pass loop filter (LF) 114.

In the described embodiment, loop filter 114 is a multi-mode loop filter that provides both a fast settle time and filtering that is comparable with filters having an increased settle time. LF 114 produces a control voltage to a voltage controlled oscillator (VCO) 116. VCO 116 produces an oscillation 118 to a first divider 120 that produces a first divided oscillation for PCS 1900 and DCS 1800 radio transceivers. The first divided oscillation is also produced to a second divider 122 that produces a second divided oscillation for GSM900 and GSM850 radio transceivers. The first and second dividers comprise fixed integer dividers in the described embodiment. Alternatively, the dividers may be operable to divide by a specified ratio that is not necessarily an integer value.

Figure 6:
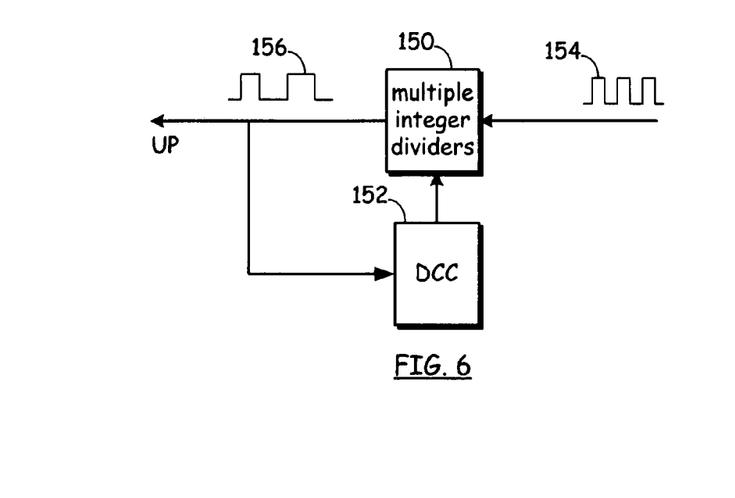
FIG. 6 is a functional block diagram of the MMD.

In the described embodiment, however, the first and second dividers in the front-end of the divider chain are fixed integer dividers, while a programmable divider, such as a multi-modulus divider (MMD) 124, utilized in a last divider stage before the feedback signal 106 is produced therefrom and is provided to the PFD 102. In the described embodiment, MMD 124 is only capable of dividing by a small number of different integer divide values whose values are periodically changed to achieve an effective fractional-N division. Here, MMD 124 sets the integer divider ratio based upon a divider control signal received from a ΔΣ MMD controller 126. ΔΣ MMD controller 126 generates control signals to MMD 124 based upon a channel select value received from channel select logic 128. In a properly designed PLL, the feedback loop properties of the fractional-N PLL results in the VCO output "locking" to a frequency equal to the product of crystal oscillator reference frequency and the "average" divide ratio of the divider chain. As indicated by FIG. 3 and FIG. 6 (as will be described below), an appropriate method of generating an "average" divide ratio by selecting from a few integer divide values is to employ an over-sampling ΔΣ modulator to control the selection of divide ratios of the MMD.

The oscillation frequency of the VCO of the PLL is based upon (is a function of) a control voltage 117. The sensitivity of the VCO to changes in the control voltage is referred to as the VCO gain, denoted $K_{VCO}$. This sensitivity is typically specified in MHz per Volt. Typical numbers for VCO gain are in the range 20-50 MHz/V. In a practical setting, the VCO typically undergoes "calibration" as part of operating the PLL. This calibration determines the operating point of the VCO and allows the VCO to function over a wide range of frequencies. This calibration process is explained in greater detail below.

The two fixed first and second divider blocks 120 and 122, respectively, of the PLL allows for the synthesizer to easily generate in-phase (I) and quadrature (Q) carrier signals in four different GSM bands, namely, the bands around 850 MHz, 900 Mhz, 1800 Mhz, and 1900 MHz, by tuning the VCO appropriately around 3.6 GHz. In fact, without the fixed divider blocks, two separate VCOs would have to be employed to support this wide range of frequency tuning.

Figure 4:
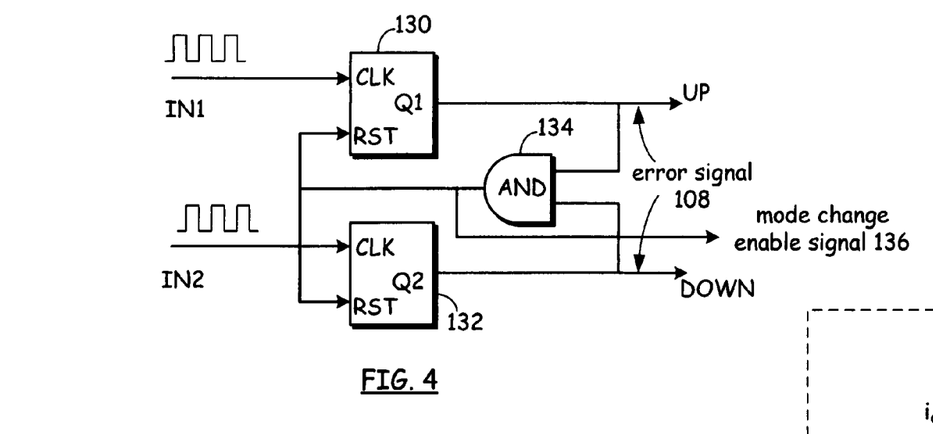
FIG. 4 is a functional block diagram of a phase-frequency detector formed according to one embodiment of the present invention.

FIG. 4 is a functional block diagram of a phase frequency detector formed according to one embodiment of the present invention. Two reset-able flip-flops 130 and 132 are coupled with an AND gate 134 in a feedback loop. Assuming that the signals IN1 and IN2 are appropriate for driving digital circuitry, the operation of the PFD is as follows. After reset, the outputs UP and DN are LOW, or 0. Whenever IN1 goes HIGH, or 1, then UP goes HIGH. When IN2 goes HIGH, DN goes HIGH momentarily, resulting in a positive edge at the AND gate output. This edge resets the two flip-flops to the initial state (UP,DN)=(0,0). Thus, any phase difference between the two signals IN1 and IN2 results in the PFD residing in the state (UP,DN)=(1,0) for a duration of time proportional to the phase difference between IN1 and IN2. Similarly, any difference in frequency between IN1 and IN2 results in the PFD residing in either the state (UP,DN)=(1,0) or the state (UP,DN)=(0, 1), depending upon the sign of the frequency difference.

In the described embodiment of the invention, IN1 is the reference signal received from a crystal and IN2 is the feedback signal received from MMD 124 from FIG. 3. As may further be seen, the output of AND gate 134 is also used as a mode change enable signal 136 as will be describe in greater detail below.

Figure 5:
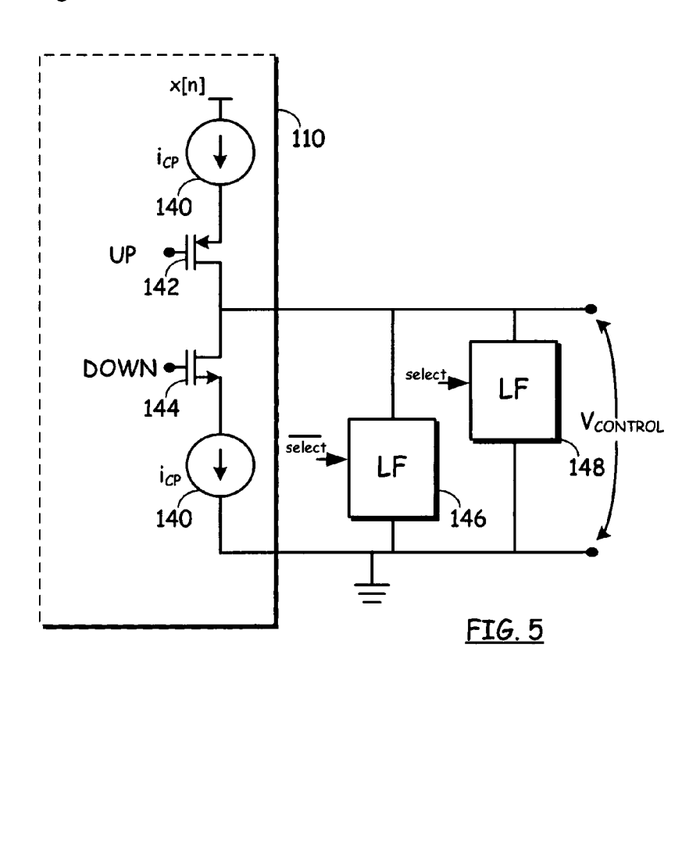
FIG. 5 is a functional block diagram of a charge pump and loop filter combination according to one embodiment of the present invention.

FIG. 5 is a functional block diagram of a charge pump and loop filter combination according to one embodiment of the present invention. The charge pump responds to the (UP,DN) control signals of error signal 108 of the PFD by either "pumping" current into the loop filter or moving current out of the loop filter and "pumping" it into ground. The charge pump 108 includes of two equally weighted (matching) current sources 140, each with a nominal output current ICP, in an arrangement with two switches implemented as MOSFETs 142 and 144 that are operatively biased by input signals UP and DN of error signal 108. As configured, MOSFET 142 is a PMOS, while MOSFET 144 is an NMOS. Thus, CP 110 essentially functions as an asynchronously clocked digital-to-analog converter (DAC) whose nominal output y CP(t) depends upon the digital inputs UP and DN such that $$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses of CP 110 are typically filtered by the loop filter thereby generating a smooth output voltage referred to as the "control voltage", $V_{CONTROL}$. Loop filters typically consists of passive components, e.g., resistors and capacitors. Typically, only one loop filter is provided for converting an error current provided by the loop filter into a voltage.

In the described embodiment, however, a pair of loop filters 146 and 148 are provided and are coupled to receive opposite states of a select signal such that only one of the two loop filters 146 and 148 is operatively selected. Moreover, as will be described in greater detail below, the loop filters 146 and 148 contain a combination of active and passive circuit elements to provide the desired loop filter characteristics. In operation, loop filter 146 is initially selected during a startup mode to provide a fast settle time while loop filter 148 is subsequently selected to provide improved filtering.

Under nominal conditions, current pulses proportional to either a phase or a frequency difference between the reference and the feedback signals are generated by the PFD/CP combination. The action of the closed feedback loop is to cause the feedback signal to eventually settle such that both signals are "locked" in both phase and frequency. The degree to which deviations away from the locked state are allowed depends upon the sharpness of the loop filter and ultimately determines the amount of "phase noise" in the output; a sharper loop filter results in less phase noise at the expense of an increased loop settling time. Essentially, the loop settling time is the amount of time it takes for the loop to settle accurately when changing from channel to channel, a topic covered in more detail in a later section.

FIG. 6 is a functional block diagram of the MMD of FIG. 3. As may be seen, divider block 150 comprises multiple selected integer dividers that divide by a selected ration based upon a divide control signal provided by divider control circuitry (DCC) 152. Thus, an input pulse stream 154 is divided by divider block 150 to produce a divided output 156. Depending upon the integer output of the ΔΣ modulator, a certain integer divide ratio is selected for the next cycle by DCC 152. The selection of a new divide ratio is triggered by a rising edge of the MMD output, and hence occurs with a rate approximately equal to the reference frequency. An all-digital ΔΣ modulator is capable of reproducing a high resolution constant input value, for example a 20-bit value, as the time average of a long sequence of coarse integer valued outputs, for example binary outputs. Specifically, on a sample-by-sample basis, the coarse ΔΣ modulator output selects the divide ratio for the next cycle. By alternating pseudo randomly between integer divide values, the ΔΣ modulator can effectively interpolate a fractional division ratio with fine resolution to accommodate frequency resolution requirements of high performance applications, such as cellular telephony. For example, if a GSM output of the fractional-N PLL frequency synthesizer lock frequency of 890.0 MHz is desired, and if a 26 MHz crystal reference oscillator is being employed, the average divide ratio of the MMD must be equal to 890/26=34.230. Thus, in FIG. 3, the "Channel Select" input to the ΔΣ modulator is the number 890/26 represented with high accuracy, for example, 20 bits. The ΔΣ modulator is operable, therefore, to output only integer valued samples, corresponding to the available divide values of the MMD, in such a fashion that the average value of the outputs equals 890/26.

This average divide ratio can be achieved in various ways. For example, if a ΔΣ modulator with binary output is employed, the MMD divides by 33 whenever the ΔΣ modulator output equals −1, and the MMD divides by 35 whenever the ΔΣ, modulator output equals 1. The ΔΣ modulator chooses between the divide ratios 33 and 35 in such a pattern that the average ratio is 890/26 and such that the sample-by-sample error—equal to the difference between the chosen integer divide value and the ratio 890/26—is modulated to predominantly occupy high frequencies.

By providing spectral shaping of the divide error, most of the error can be removed by the low pass loop filter (LPF), resulting in a high quality output oscillation, or, equivalently, an output oscillation with very little "phase noise", approximately as if the feedback path implemented a true fractional divider.

For fractional-N PLL frequency synthesis, two types of ΔΣ modulators are used in the described embodiments of the invention. One is a "single-quantizer" ΔΣ modulator and the other is a "MASH" ΔΣ modulator.

Figure 7:
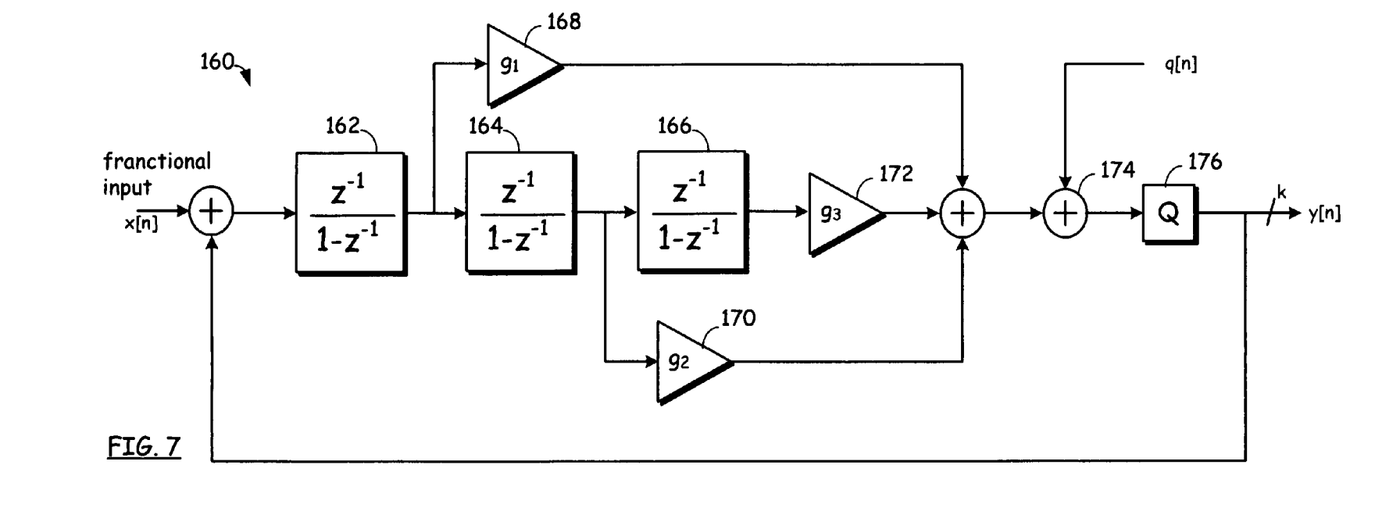
FIG. 7 is a functional block diagram of a third order $\Delta\Sigma$ modulator with a single quantizer as used in one embodiment of the invention.

FIG. 7 is a functional block diagram of a third order ΔΣ modulator with a single quantizer as used in one embodiment of the invention. The third order ΔΣ modulator 160 of FIG. 7 produces an output, typically a few bits, but can be as coarse as a single bit. As may be seen in FIG. 7, the ΔΣ modulator 160 includes three integrators 162, 164, and 166 and amplifiers 168, 170 and 172 that provide gains $g_1$, $g_2$ and $g_3$, respectively, coupled in a feed-forward constellation. For the purposes of performance analysis, the ΔΣ modulator of FIG. 7 is shown as a linearized model in which a quantization noise, q[n], is modeled as a white, additive noise source, and is summed by summing element 174 prior to an output quantizer 176 and is uncorrelated with the input. The quantization noise transfer function, NTF, describes the transfer function between the output y[n] and q[n], i.e., NTF(z)=Y(z)/Q(z) and is used to—both qualitatively and quantitatively—estimate the quantization noise floor at the ΔΣ modulator output. The ΔΣ modulator of FIG. 7 yields an NTF that for low frequencies satisfies $$NTF(z) \propto (1-z^{-1})^3.$$

Thus, three coincident zeros at DC are present in the NTF, and hence quantization noise is rejected strongly close to DC and increases monotonically for higher frequencies.

Figure 8:
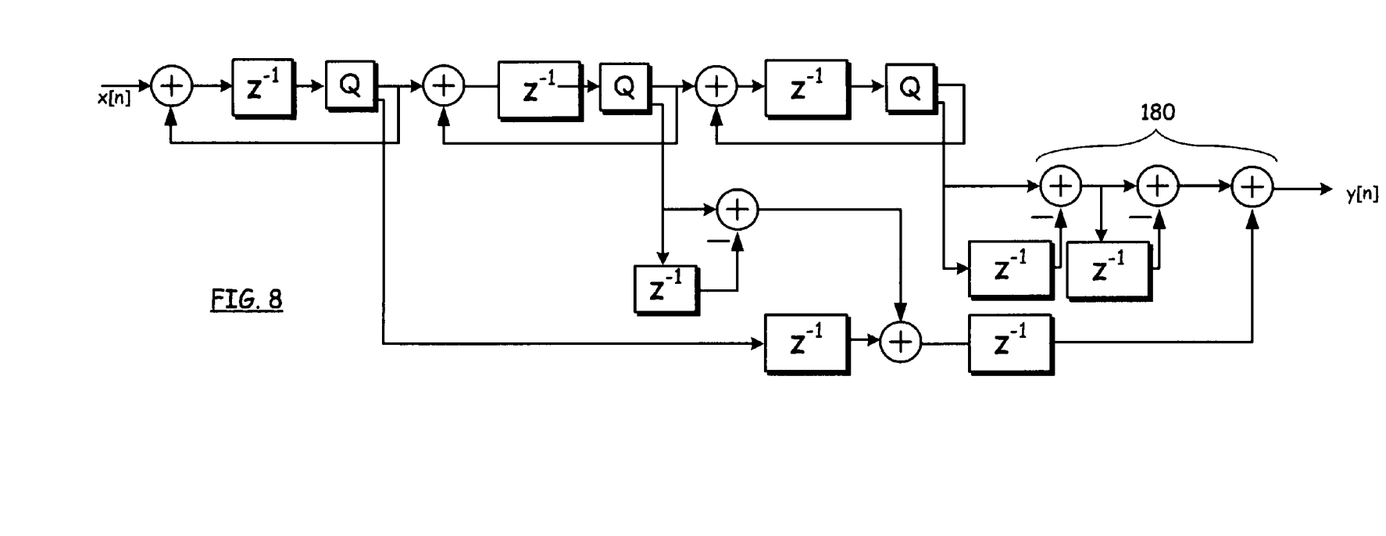
FIG. 8 is a functional block diagram of a third order-"MASH" ΔΣ modulator that is utilized in one embodiment of the present invention.

FIG. 8 is a functional block diagram of a third order "MASH" ΔΣ modulator that is utilized in one embodiment of the present invention. The output of MASH ΔΣ modulators is multi-bit since multiple quantizer outputs are combined by the summing elements shown at 180 to form the overall MASH ΔΣ modulator output y[n]. The NTF of the third order MASH ΔΣ modulator includes three coincident zeros at DC.

Figure 9:
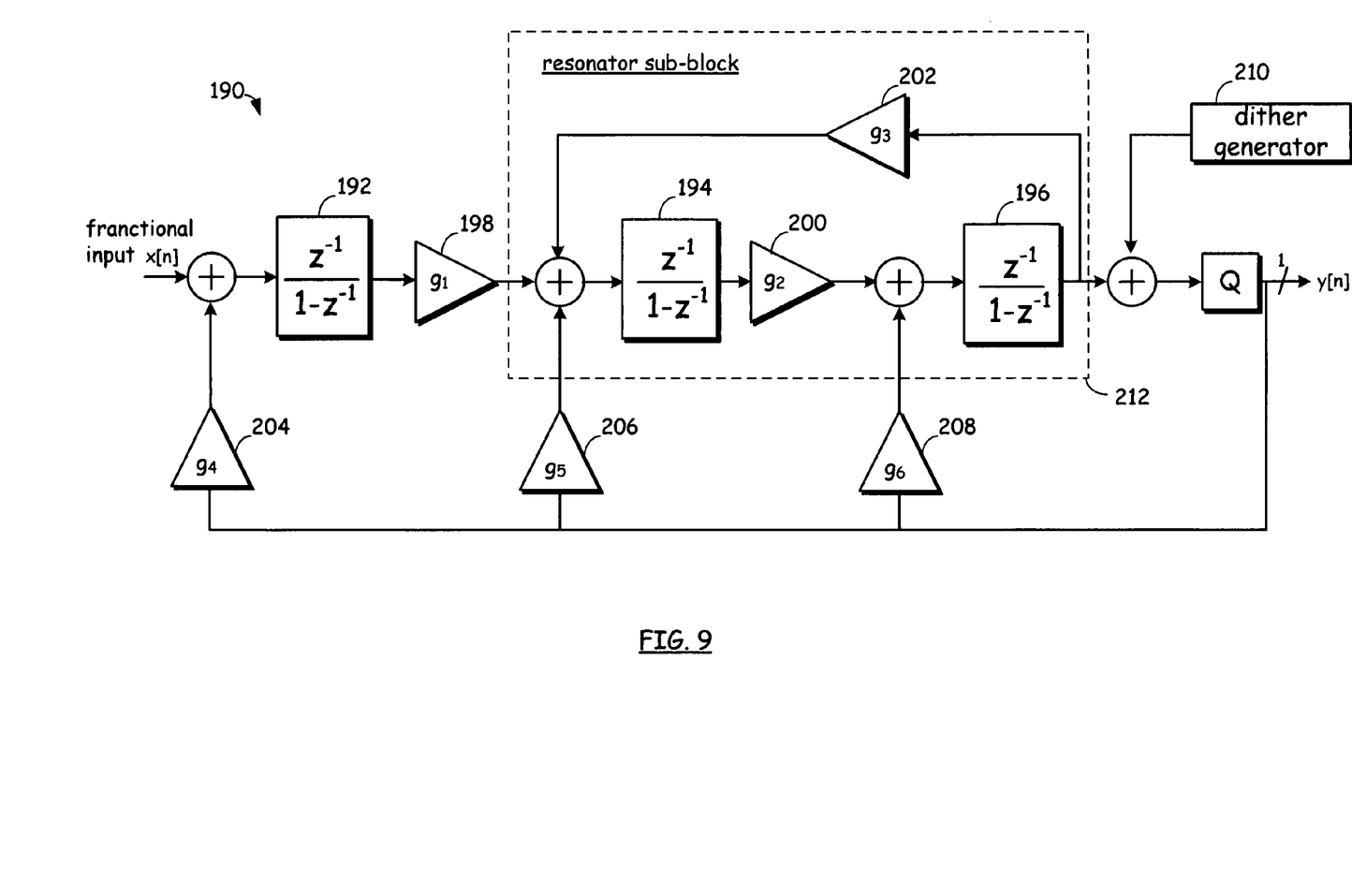
FIG. 9 is a single-bit *ΔΣ modulator for employment in fractional-N PLL frequency synthesizers that is utilized in yet another embodiment of the present invention.

FIG. 9 is a single-bit ΔΣ modulator for employment in fractional-N PLL frequency synthesizers that is utilized in yet another embodiment of the present invention. The structure of the modulator 190 of FIG. 9 includes an input labeled "Fractional Input" for receiving an input x[n], three integrators, 192, 194, and 196 and six amplifiers 198, 200, 202, 204, 206 and 208 that provide digital gains $g_1, \ldots, g_6$, respectively. As with other ΔΣ modulators, the input is a high-resolution digital word, for example 20 bits of resolution, and through appropriate modulation is converted to a sequence of +1s and −1s whose time-average equals the value of the fractional input. In the described embodiment, a modulator clock rate is equal to a crystal reference clock rate of 26 MHz. A Dither Generator 210 generates an appropriate amount of dither to prevent the ΔΣ modulator from generating undesired spurious contents in the output. The ΔΣ modulator of FIG. 9 includes a digital resonator structure 212 in order to provide for quantization noise optimization. The digital modulator includes integrators 194 and 196 and amplifiers 200 and 202 coupled in a feedback constellation as shown. Incorporating such a resonator structure 212 in the ΔΣ modulator yields an NTF that, for low frequencies, satisfies $$NTF(z) \propto (1-z^{-1})((1-z^{-1})^2 + g_2 g_3 z^{-2}).$$

Factorizing the second term in the above expression, $$NTF(z) \propto (1-z^{-1})(1-(1-j\sqrt{g_2 g_3})z^{-1})(1-(1+j\sqrt{g_2 g_3})z^{-1}).$$

Thus, the NTF zeros are defined by $$NTF(z)=0 \text{ for } z=1, (1-j\sqrt{g_2 g_3}), (1+j\sqrt{g_2 g_3}).$$

It follows that choosing gain levels $g_2$ and $g_3$ appropriately for amplifiers 200 and 202 allows for zeros that do not coincide with DC. This fact can be used to improve the signal-to-noise ratio of the ΔΣ modulator. In addition, the resonator of the ΔΣ modulator tends to keep the quantizer input more "busy" which, in turn, improves the randomness of the quantization noise, resulting in reduced tendency to generate spurs in the output signal. One of average skill in the art may readily construct and implement any of the modulators of FIGS. 7-9.

Figure 10:
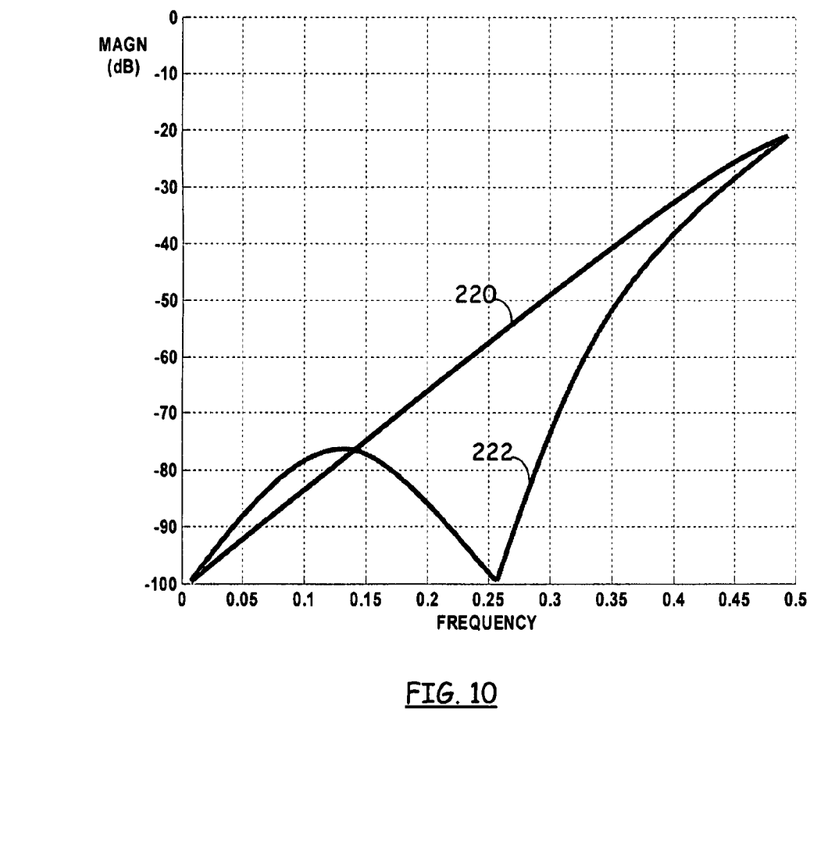
FIG. 10 is a graph illustrating the concept of noise shaping that may be achieved utilizing the modulator of FIG. 9 according to one embodiment of the invention.

FIG. 10 is a graph illustrating the concept of noise shaping that may be achieved utilizing the modulator of FIG. 9 according to one embodiment of the invention. The graph of FIG. 9 specifically illustrates an advantage of using the modulator of FIG. 9 in relation to the modulator of FIG. 7. Specifically, for low frequencies, the frequency-magnitude response shown at 220 corresponds to the NTF magnitude response of the ΔΣ modulator of FIG. 7, while the frequency-magnitude response shown at 222 corresponds to the NTF magnitude response of the ΔΣ modulator of FIG. 9. As can be seen, the resulting "extra" zero has been placed at a low frequency to provide an improved signal-to-noise ratio of bandwidths that are somewhat wider (approximately 20%) than the location of the "extra" zero.

Figure 11:
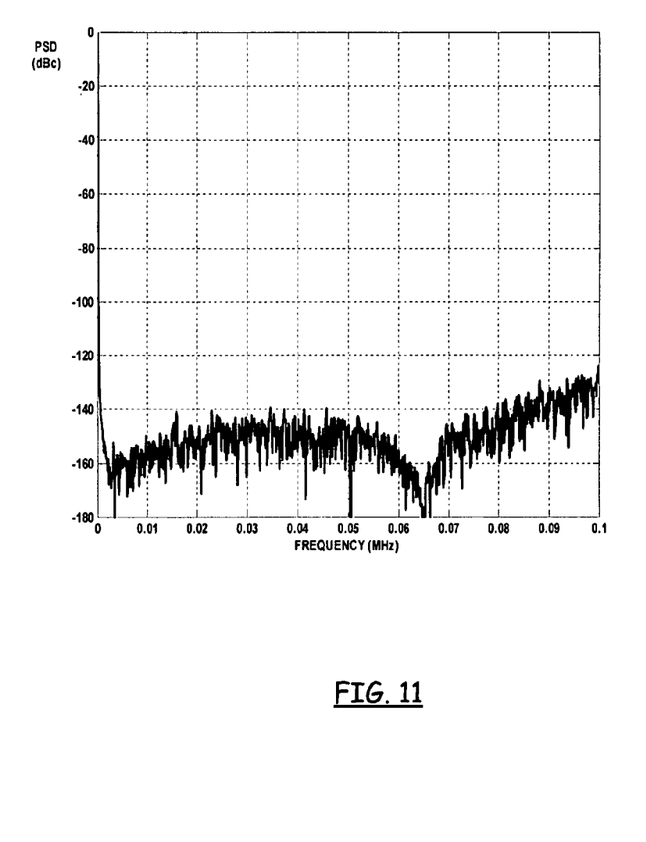
FIG. 11 is a graph illustrating a power spectral density of a PLL according to one embodiment of the invention utilizing the modulator of FIG. 9.

FIG. 11 is a graph illustrating a power spectral density of a PLL according to one embodiment of the invention utilizing the modulator of FIG. 9. As may be seen from FIG. 9, the effects of "extra" zero of the NTF yields an improved signal-to-noise ratio for a bandwidth around 65 kHz. For the described example of FIG. 11, the ΔΣ modulator coefficients were $g_1=1$, $g_2=2^{-6}$, $g_3=2^{-6}$, $g_4=1$, $g_5=5$, $g_6=0.3125$, resulting in NTF zeros at DC and at approximately 65 kHz.

Generally, for fractional-N PLL frequency synthesizers, the ΔΣ modulator architecture should be chosen carefully. In addition to the in-band noise shaping, the out-of-band shaped noise substantially affects the synthesizer phase noise performance. Comparing the noise shaping performance of the multi-bit single-quantizer ΔΣ modulator and the MASH ΔΣ modulator, the former can achieve more desirable noise shaping because of lower out-of-band noise power, but the latter represents a simpler, high-order ΔΣ modulator architecture with no stability problem. In addition, MASH ΔΣ modulators generate more widespread output patterns, and thus impose more stringent requirements on the phase detector design. Widely spread ΔΣ modulator output value patterns make the synthesizer more sensitive to substrate noise coupling since the ΔΣ modulator turn-on time of the charge pump in the locked condition is larger than a ΔΣ modulator with fewer bit of output resolution. Also, linearity requirements on the PFD/CP combination are increase with stronger varying turn-on times. With its susceptibility to substrate noise coupling, this phenomenon is particularly troublesome in CMOS implementations. Thus, to minimize substrate noise coupling, the output resolution of the ΔΣ modulator should ideally be single bit, since this provides the shortest turn-on time of the charge pump in locked condition.

TABLE A

Phase Noise Requirements Relative to Frequency Offset

| FREQUENCY OFFSET (kHz) | REQUIRED $P_{PH}$ (dBc/Hz) |
| --- | --- |
| 400 | −130 |
| 600 | −134 |
| 1400 | −138 |
| 10000 | −161 |
| 20000 (TX Mode) | −165 |

Table A shows the phase noise requirements of the quad-band frequency synthesizer for operation in the GSM band. For example, at a frequency offset of 400 kHz, the required phase noise level is −130 dBc/Hz. In addition to very strict phase noise requirements, the GSM standard requires RF carrier frequency settling to an absolute accuracy of 90 Hz within 280 us. The term "settling" here describes the excursion of the RF carrier vs. time as the synthesizer changes RF channel. As mentioned above, the VCO is typically calibrated for every channel hop. This calibration process involves a sequence of switching in and out of capacitors that tune the operation frequency of the VCO. For all frequencies, the required spurious performance level is −110 dBc.

Typically, calibration of a PLL occurs in two stages. Initially, an open loop stage serves to place an output oscillation with an approximate deviation of a desired frequency of oscillation. Thus, the open loop stage is followed by a closed loop phase that is for locking the oscillation to a desired frequency of oscillation. After open loop calibration is completed, the VCO oscillation frequency may, however, be off by many MHz relative to the target frequency. A typical scenario is that the VCO is off by 10 MHz relative to the desired frequency. Thus, after calibration, the closed loop calibration stage of the PLL is operable to drive the VCO to the desired operating frequency by driving the control voltage to an appropriate value. This process of driving the control voltage to the appropriate value is referred to as the frequency synthesizer settling.

Generally, in prior art frequency synthesizers, the strict phase noise requirements and the requirements of fast frequency synthesizer settling are conflicting requirements; a narrow loop bandwidth reduces phase noise at the RF carrier at the expense of increased settling time. For example, a synthesizer in combination with a loop filter that satisfy the strict phase noise requirements listed above typically have settle time that, for example, may equal 180-200 micro-seconds. This settle time, however, does not satisfy settle time requirements. Conversely, a combination of a desired synthesizer and loop filter that satisfy settle time requirements typically provide excessive levels of phase noise.

The tension between settle time requirements and phase noise limitations for fast settling fractional-N PLL frequency synthesizers with high performance ΔΣ modulators and narrow PLL signal filter bandwidths should desirably reduce settle time values from typical values of 180 micro-seconds to, preferably, approximately 100-110 micro-seconds while satisfying phase noise requirements.

Figure 12:
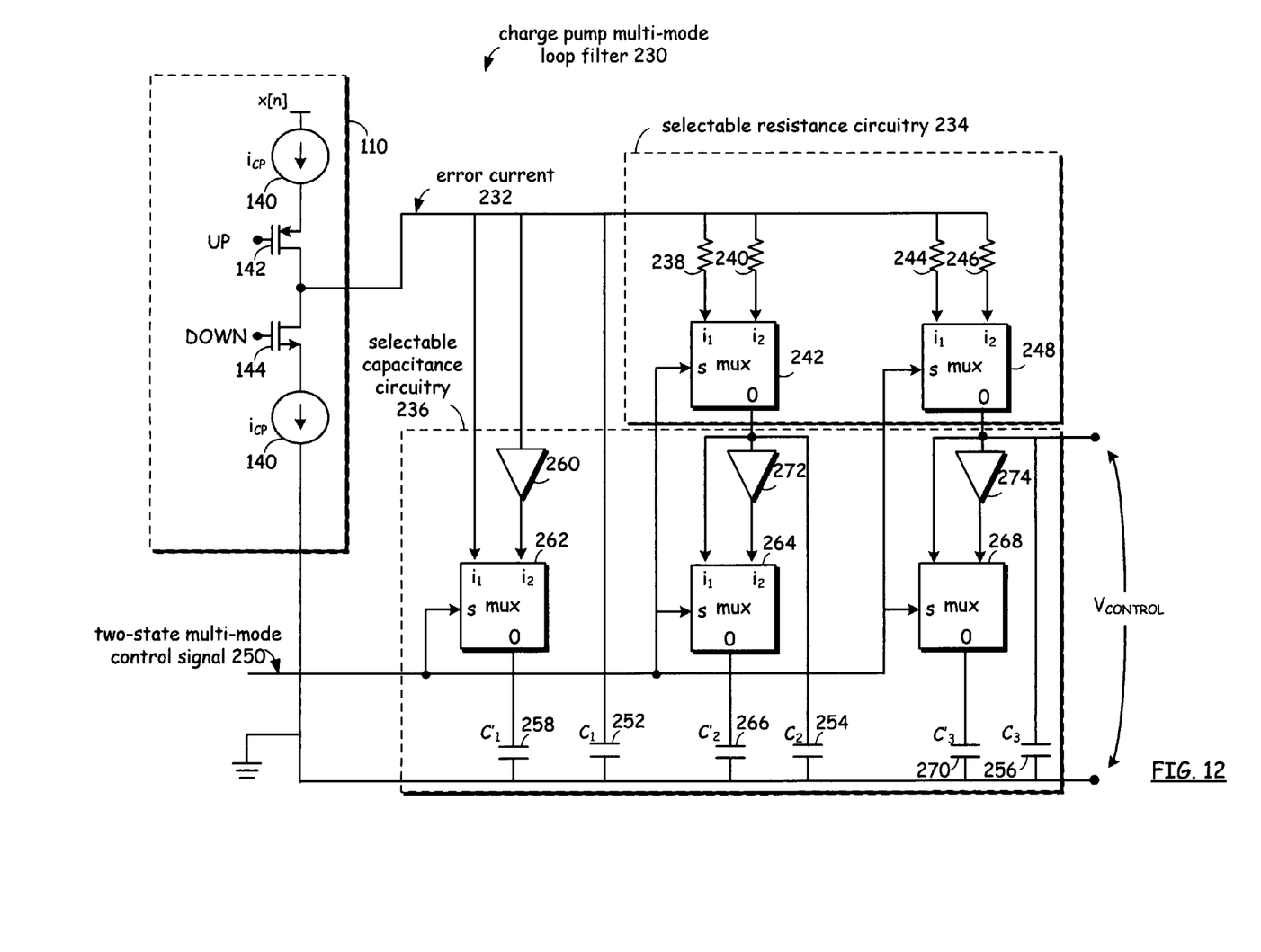
FIG. 12 is a functional schematic block diagram of a dual mode loop filter according to one embodiment of the invention that provides filtration that satisfies phase noise requirements when used in conjunction with a specified digital modulator according to one embodiment of the invention.

FIG. 12 is a functional schematic block diagram of a dual mode loop filter according to one embodiment of the invention that provides filtration that satisfies phase noise requirements when used in conjunction with a specified digital modulator according to one embodiment of the invention. Generally, the charge pump multi-mode loop filter 230 of FIG. 12 provides adequate filtering while providing a settle time that is approximately equal to 110 microseconds.

The connectivity of charge pump and loop filter combination of the frequency synthesizer of the present invention are shown here in FIG. 12. The charge pump 110 is similar to the charge pump of FIG. 5. Charge pump 110 is coupled to receive error signal 108 produced by the PFD which error signal 108 includes the UP and DOWN signals to operatively bias MOSFETs 142 and 144 according to whether current is to be sourced into the loop filter or removed from the loop filter.

Charge pump 110 produces error current 232 based upon error signal 108. In the described embodiment, error current is received by both selectable resistance circuitry 234 and selectable capacitance circuitry 236. It is understood, however, that the configuration of selectable resistance circuitry 234 may readily be modified in relation to selectable capacitance circuitry 236 according to design requirements. For example, error current 232 may be produced solely to only one of selectable resistance circuitry 234 and selectable capacitance circuitry 236.

Selectable resistance circuitry 234 comprises two pairs of selectable resistors to create selectable resistance values. As may be seen, two resistors 238 and 240 are coupled to mux 242 and two resistors 244 and 246 are coupled to mux 248. Muxes 242 and 248 are operable to jointly select resistors 238 and 244 or resistors 240 and 246 based upon a state of a two-state multi-mode control signal 250. The coupled resistors are coupled to an output node "O" of muxes 242 and 248.

Selectable capacitance circuitry 236 includes three selectable capacitors that are operatively coupled to three permanently coupled capacitors based upon the state of the two-state multi-mode control signal 250. Specifically, there capacitors 252, 254 and 256 are permanently coupled to provide filtering for the multi-mode loop filter. Capacitor is coupled is receive error current 232 while capacitors 254 and 256 are coupled to the output nodes "O" of muxes 242 and 248, respectively. Capacitors 258, on the other hand, is selectively coupled either to receive error current 232 or an output of buffer 260 based upon the two-state multi-mode control signal 250. The buffer 260, which may also be referred to as a voltage follower circuit, has the property that its output voltage is equal to, or "follows", the input voltage, but provides a very high input impedance. When coupled to receive error current 232, capacitor 258 is operatively coupled to the loop filter and the capacitance of capacitor 258 may be added to the capacitance of capacitor 252. When coupled to the output of buffer 260, capacitor 258 may charge to match the output voltage of buffer 260 (which is equal to the input voltage of buffer 260) thereby allowing capacitor 258 to charge to a level that matches capacitor 252. Because buffer 260 has a very high input impedance, however, capacitor 258 is operatively decoupled from the multi-mode loop filter of FIG. 12.

Buffer 260, by charging capacitor 258 when coupled to capacitor 258 by mux 262, enables capacitor 258 to be operatively coupled into the multi-mode loop filter without depleting charge of other capacitors, such as capacitor 252. Among other advantages, no additional settle time is required when the multi-mode loop filter transitions from a startup mode to a steady state mode of operation.

Similarly, mux 264 operatively couples capacitor 266 and mux 268 operatively couples capacitor 270 to the multi-mode loop filter and in parallel to capacitors 272 and 274, respectively, based upon the same state of the two-state multi-mode control signal 250 that operatively couples capacitor 258 to the multi-mode loop filter. As before, when operatively decoupled from the multi-mode loop filter, capacitors 266 and 270 are coupled to receive charge from buffers 272 and 274 through muxes 264 and 268. Consistent with the described operation, it may be seen that either capacitor 266 or buffer 272 is coupled to receive the output of mux 242 along with capacitor 254 while either capacitor 270 or buffer 274 is coupled to receive the output of mux 248 along with capacitor 256. Functionally, the above described operation of the charge pump multi-mode loop filter 230 may be viewed as two separate loop filters selectively operating in conjunction with a charge pump as described in relation to FIG. 5. The topology of the multi-mode loop filter of FIG. 12, however, is more efficient than implementing two separate and selectable loop filters as shown in FIG. 5.

The mode of operation of the combination of the frequency synthesizer and loop filter of the present invention is as follows. Immediately following the VCO calibration, the loop filter is programmed to employ resistors and capacitors that result in a large bandwidth of the PLL signal filter in the startup mode of operation. Specifically, in one embodiment, capacitive and resistive elements are selected to create a 150 kHz bandwidth response of the loop filter. This setting causes very fast initial settling. After a specified settle time has elapsed (e.g., 20 us), the loop filter is programmed to employ resistive elements and capacitive elements that result in a narrow bandwidth of the PLL signal filter and a slower settle time of the frequency synthesizer, but allows for very low phase noise levels. Specifically, for the example at hand, a 35 kHz bandwidth is employed for such narrow bandwidth operation in one embodiment of the invention. Change of loop filter parameters during the settling period is subsequently referred to as a "gear shift", since it changes the speed of frequency synthesizer settling.

Initially, the loop filter gear shift operates as follows. Initially, immediately following VCO calibration, the two-state multi-mode control signal 250 is set equal to zero, and the loop filter resistances are provided by resistors 240 and 246. The loop filter capacitances are provided by capacitors 252, 254 and 256, while buffers 260, 272 and 274 continuously keep the voltage drops of capacitors 258, 266 and 270 at the same levels as the voltage drops over capacitors 252, 254 and 256, respectively. After a specified amount of time, e.g., 20 us, the loop filter gear shift is activated by setting the two-state multi-mode control signal 250 equal to one. Doing so changes the loop filter resistances to resistance values provided by resistors 238 and 244, and the loop filter capacitances by the capacitance values of capacitors 258 summed with capacitor 252, capacitor 266 summed with capacitor 254, and capacitor 270 summed with capacitor 256. The presence of the buffers ensures that no abrupt change occurs on the control voltage $V_{ctrl}$. This, in turn, starts the frequency synthesizer settling from the same control voltage as prior to the gear shift.

Exemplary values that may be used as the loop filter components are as follows:
$C_1$=5.22 pF, $C'_1$=1.05 nF,
$C_2$=522 pF, $C'_2$=10.5 nF,
$C_3$=26.1 pF, $C'_3$=524 pF,
$R_2$=2.36 kΩ, R'2=10.81 kΩ,
$R_3$=2.36 kΩ, R'3=10.81 kΩ

Finally, while the described embodiments include references to capacitors and resistors, it should be understood that functional equivalent devices such as resistor and capacitor configured MOSFETs and other known substitute devices may be used.

Figure 13:
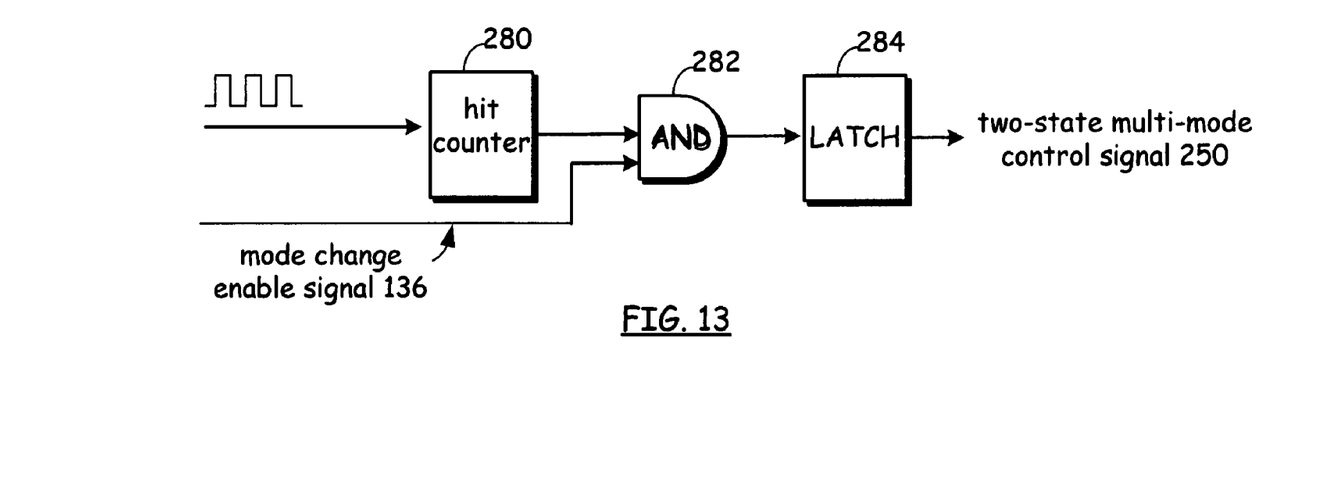
FIG. 13 is a functional block diagram of a loop filter gear shift timer according to one embodiment of the invention.

FIG. 13 is a functional block diagram of a loop filter gear shift timer according to one embodiment of the invention. A counter 280 is coupled to receive a clock signal from a digital clock source. Once the counter hits a preprogrammed value, the output signal becomes a logic one. If the mode change enable signal 136 as set by the circuitry of FIG. 4 is logic one, AND gate 282 produces a logic one and a latch 284 output S goes high to prompt the loop filter gear shift (to cause the multi-mode loop filter to transition from a startup mode to a steady state mode). The mode change enable signal 136 is derived from the PFD, as shown in FIG. 4, and ensures that the gear shift operation does not occur during a time where the charge pump is activated.

Figure 14:
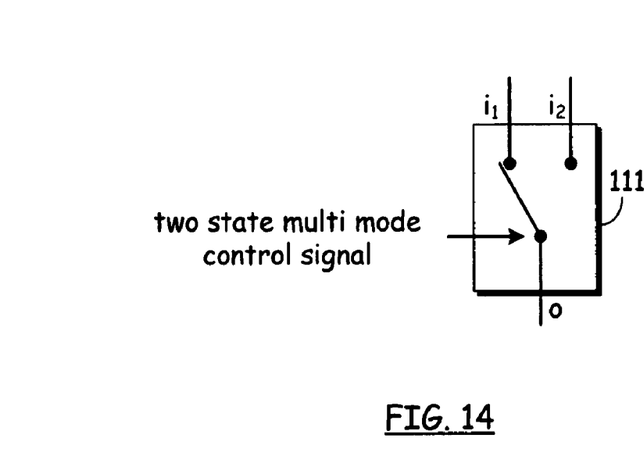
FIG. 14 is a functional block diagram conceptually illustrating operation of a mux according to the embodiments of the present invention.

FIG. 14 is a functional block diagram conceptually illustrating operation of a mux according to the embodiments of the present invention.

Figure 15:
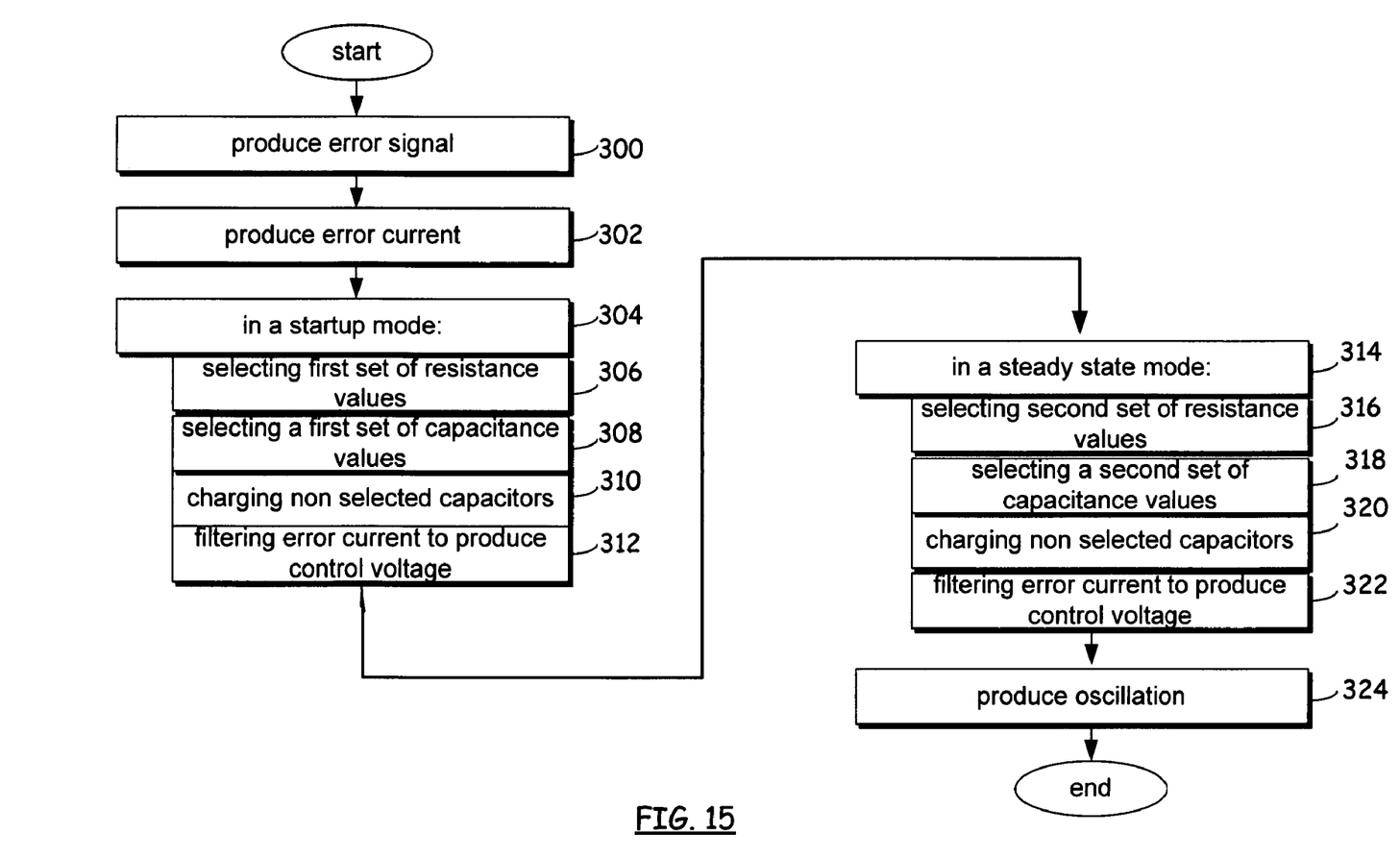
FIG. 15 is a flowchart illustrating a method for producing an oscillation according to one embodiment of the invention.

FIG. 15 is a flowchart illustrating a method for producing an oscillation according to one embodiment of the invention. Initially, the method includes producing an error signal (step 300) and producing a corresponding error current (step 302). If the PLL is in a start up mode of operation (step 304), the method includes selecting a first set of resistance values (step 306) and further selecting a first set of capacitance values (step 308). The method further includes charging non selected capacitors (step 310) and filtering error current to produce control voltage (step 312).

If the PLL is in a steady state mode of operation (step 314), the method includes selecting second set of resistance values (step 316) and selecting a second set of capacitance values (step 318). The method further includes charging non selected capacitors (step 320), if any are not operatively coupled to filter. Finally, the method includes filtering the error current to produce control voltage (step 322) and producing the output oscillation (step 324).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

An integrated circuit radio transceiver and method therefore includes a phase locked loop having a multi-mode loop filter that is operable to provide wide band response with a fast settle time in a startup mode of operation and a relatively more narrow response with a longer settle time but with improved filtering in a steady state mode of operation according to one embodiment of the invention. The multi-mode loop filter includes, in one embodiment, selectable resistance circuitry for selecting between a plurality of resistance values based upon a two-state multi-mode control signal to provide the selected resistance values and selectable capacitance circuitry for selecting between a plurality of capacitance values based upon the two-state multi-mode control signal and for operatively coupling selected capacitors to selected resistors to provide the selected capacitance values.

As a further aspect of the embodiments of the present invention, the multi-mode loop filter includes buffers for charging non-selected capacitors while not operationally coupled to the multi-mode loop filter so that, when switched to be operatively coupled, the capacitors being switched in do not deplete charge from capacitors already coupled to filter within the loop filter and to avoid additional settle time for the circuitry. Thus, when the selectable capacitors are not operatively coupled to provide filtering, the buffers serve to charge the capacitors to a steady state charge level of the capacitors that are coupled to provide filtration. Because the buffers have very high input impedance, however, the capacitors are operatively de-coupled from the loop filter. When the buffer is removed from coupling by a mux, however, the charged selectable capacitor then is parallel coupled to a corresponding capacitor in a described embodiment of the invention and provides additional capacitance that serves to reduce the loop filter bandwidth and to improve filtering. The two-state multi-mode control signal is operable to select between the plurality of resistance values and capacitance values to select between the startup mode and the steady state mode in the described embodiment of the invention. While one described embodiment includes both selectable resistors and selectable capacitors, it is understood that alternate embodiments may include either selectable resistors or selectable capacitors, but not both.

A method of the embodiments of the present invention for producing a phase-locked loop includes producing an error signal based upon a phase difference between a reference signal and a feedback signal, producing an error current based upon the error signal, producing a control voltage based upon the error current, producing an oscillation based upon the control voltage and operating in a startup mode characterized by a wide-band response with a fast settle time and then operating in a steady state mode characterized by narrow-band response with improved filtering.

The method further includes selecting between a plurality of resistance values based upon a two-state multi-mode control signal to provide the selected resistance values and selecting between a plurality of capacitance values based upon the two-state multi-mode control signal and operatively coupling selected capacitors to selected resistors to provide the selected capacitance values. Additionally, to prevent signal fluctuations and possible add to required settle times for a circuit, the method includes charging non-selected capacitors while not operationally coupled to the multi-mode loop filter.

The invention claimed is:

1. A phase locked loop (PLL), comprising:
   a phase frequency detector operable to produce an error signal based upon a phase difference between a reference signal and a feedback signal;
   a charge pump operable to produce an error current based upon the error signal;
   a multi-mode loop filter operable to produce a control voltage based upon the error current;
   an oscillator operable to produce an oscillation and the feedback signal in an undivided form based upon the control voltage;
   selectable resistance circuitry of the multi-mode loop filter for selecting between a plurality of resistance values based upon a two-state multi-mode control signal to provide the selected resistance values;
   selectable capacitance circuitry of the multi-mode loop filter for selecting between a plurality of capacitance values based upon the two-state multi-mode control signal and for operatively coupling selected capacitors to selected resistors to provide the selected capacitance values;
   buffers for charging non-selected capacitors of the selectable capacitance circuitry while not operationally coupled to the multi-mode loop filter; and
   wherein the two-state multi-mode control signal is operable to select between the plurality of resistance values and capacitance values to select between the startup mode and the steady state mode and wherein the multi-mode loop filter operates in a startup mode characterized by a wide-band response with a fast settle time and in a steady state mode characterized by narrow-band response with improved filtering.

2. The PLL of claim 1 wherein the multi-mode loop filter includes:
   multi-value resistance logic operable to produce a first resistance value based upon a first state of a two-state multi-mode control signal and a second resistance value based upon a second state of the two-state multi-mode control signal;
   multi-value capacitance logic operable to produce a first capacitance value based upon the first state of the two-state multi-mode control signal and a second capacitance value based upon the second state of the two-state multi-mode control signal; and
   wherein selected capacitors provide one of the first and second capacitance values and selected resistors provide one of the first and second resistance values are operatively coupled to convert error current received from the charge pump to the control voltage.

3. The PLL of claim 2 wherein the multi-value capacitance logic further includes switching logic to selectively couple at least one buffer in series with at least one capacitor wherein, when coupled, is coupled between an input node of the multi-value capacitance logic and the at least one capacitor and wherein when not coupled, the at least one capacitor is coupled directly to the input node.

4. The PLL of claim 1 wherein the multi-mode loop filter includes multi-value capacitance logic that includes a plurality of capacitors coupled to receive a charge wherein, when the PLL is in a startup mode of operation, is operable to couple at least one buffer in series with at least one capacitor to enable the at least one capacitor to continue to charge while removing the at least one capacitor from operation of the PLL.

5. The PLL of claim 1 wherein the phase frequency detector produces a multi-state error signal further to drive the charge pump and further wherein the phase frequency detector produces a mode change enable signal to allow the multi-mode loop filter to change between the startup mode and the steady state mode once a specified time value has expired.

6. The PLL of claim 5 wherein the mode change enable signal is only set to an enable state when the error signal is in a state that does not result in the error current being produced to the multi-mode loop filter.

7. The PLL of claim 5 further including timing logic to produce a mode shift signal once a specified number of pulses have been received from a clock and once the mode change enable signal is set.

8. The PLL of claim 1 further including multi-modulus divider for dividing an oscillation by a selected value and further including a delta-sigma modulation control logic for selecting a divider ratio of the multi-modulus divider.

9. A method within a phase-locked loop (PLL), comprising:
producing an error signal based upon a phase difference between a reference signal and a feedback signal;
producing an error current based upon the error signal;
producing a control voltage based upon the error current;
producing an oscillation based upon the control voltage;
selecting between a plurality of resistance values in a multi-mode loop filter based upon a two-state multi-mode control signal to provide the selected resistance values;
selecting between a plurality of capacitance values based upon the two-state multi-mode control signal and operatively coupling selected capacitors to selected resistors to provide the selected capacitance values;
charging non-selected capacitors while not operationally coupled to the multi-mode loop filter; and
wherein selecting comprises selecting a first set of resistance values and capacitance values in a startup mode and selecting a second set of resistance values and capacitance values in a steady state mode of operation and operating in a startup mode characterized by a wide-band response with a fast settle time and then operating in a steady state mode characterized by narrow-band response with improved filtering.

10. The method of claim 9 further including:
producing a first resistance value based upon a first state of a two-state multi-mode control signal and producing a second resistance value based upon a second state of the two-state multi-mode control signal;
producing a first capacitance value based upon the first state of the two-state multi-mode control signal and producing a second capacitance value based upon the second state of the two-state multi-mode control signal; and
converting error current received from the charge pump to the control voltage.

11. The method of claim 10 further including selectively coupling at least one buffer in series with at least one capacitor to charge the at least one capacitor while the at least one capacitor is not operatively coupled to provide filtering.

12. The method of claim 9 further including determining that a specified amount of time has passed and that the loop filter should be changed from a start up mode to a steady state mode of operation.

13. The method of claim 12 further including producing a multi-state error signal to drive the charge pump and further producing a mode change enable signal to allow the multi-mode loop filter to change between the startup mode and the steady state mode once the specified time value has passed.

14. The method of claim 13 further including setting the mode change enable signal to an enable state only when the error signal is in a state that does not result in the error current being produced to the multi-mode loop filter.

15. The method of claim 13 further including produce a mode shift signal once a specified number of pulses have been received from a clock and once the mode change enable signal is set.

16. The method of claim 9 further including selecting a divider ratio and dividing an oscillation by a selected value.

17. A loop filter, comprising:
resistance circuitry coupled to receive an error current;
capacitance circuitry operatively coupled to the resistance circuitry wherein the capacitance and resistance for a multi-mode loop filter having a specified bandwidth;
buffer circuitry for charging non-selected capacitors while not operationally coupled to the multi-mode loop filter; and
wherein the capacitance circuitry includes at least one capacitor selectively coupled to the buffer circuitry wherein the at least one capacitor is operatively coupled to reduce the specified bandwidth of the loop filter and to provide filtering in a steady state mode of operation of the loop filter and wherein the at least one capacitor is operatively decoupled from the loop filter in a startup mode of operation while receiving a charge from the buffer circuitry.

18. The loop filter of claim 17 wherein the resistance circuitry is operable to provide a first resistance value during the startup mode of operation and a second resistance value during a steady state mode of operation.

* * * * *